(12) United States Patent
Chen et al.

(10) Patent No.: US 11,569,164 B2
(45) Date of Patent: Jan. 31, 2023

(54) SEMICONDUCTOR DEVICE WITH POLYGONAL INDUCTIVE DEVICE

(71) Applicant: TAIWAN SEMICONDUCTOR MANUFACTURING COMPANY LTD., Hsinchu (TW)

(72) Inventors: Wen-Sheng Chen, Taipei (TW); An-Hsun Lo, Hsinchu (TW); En-Hsiang Yeh, Hsin-Chu (TW); Tzu-Jin Yeh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 21 days.

(21) Appl. No.: 16/880,336

(22) Filed: May 21, 2020

(65) Prior Publication Data
US 2020/0279808 A1    Sep. 3, 2020

Related U.S. Application Data

(63) Continuation of application No. 15/965,618, filed on Apr. 27, 2018, now Pat. No. 10,672,704.

(Continued)

(51) Int. Cl.
*H01L 23/522*    (2006.01)
*H01L 49/02*    (2006.01)

(52) U.S. Cl.
CPC ...... *H01L 23/5226* (2013.01); *H01L 23/5227* (2013.01); *H01L 28/10* (2013.01)

(58) Field of Classification Search
CPC .. H01L 23/5226; H01L 28/10; H01L 23/5227
See application file for complete search history.

(56) References Cited

U.S. PATENT DOCUMENTS

| 7,936,046 B2* | 5/2011 | Chung | H01L 21/76229 |
|---|---|---|---|
| | | | 257/E21.022 |
| 8,405,482 B2* | 3/2013 | Cho | H01L 23/5225 |
| | | | 336/200 |

(Continued)

FOREIGN PATENT DOCUMENTS

CN    1734767 A    2/2006

OTHER PUBLICATIONS

Office action, Cited References and Search report dated Oct. 11, 2021 issued by the Chinese National Intellectual Property Administration (CNIPA) for the Chinese counterpart application No. 201811128377.X.

*Primary Examiner* — Dale E Page
*Assistant Examiner* — Quovaunda Jefferson
(74) *Attorney, Agent, or Firm* — WPAT Law; Anthony King (57) ABSTRACT

A semiconductor device includes: a polygonal inductive device disposed on a first layer on a substrate, the polygonal inductive device including a first line portion; a first conductive line disposed on a second layer on the substrate; a second conductive line disposed on a third layer on the substrate; and a first conductive via arranged to electrically couple the second conductive line to the first conductive line; wherein the first layer is different from the second layer and the third layer, the first conductive line is electrically connected to a reference voltage, and the first conductive line crosses the first line portion viewing from a top of the semiconductor device.

20 Claims, 11 Drawing Sheets

Related U.S. Application Data

(60) Provisional application No. 62/592,974, filed on Nov. 30, 2017.

(56) References Cited

U.S. PATENT DOCUMENTS

| | | | |
|---|---|---|---|
| 10,497,646 B2 * | 12/2019 | Liang | H01L 23/49822 |
| 2006/0030115 A1 * | 2/2006 | Chung | H01L 21/76229 |
| | | | 438/381 |
| 2013/0093045 A1 * | 4/2013 | Cho | H01L 21/02 |
| | | | 257/531 |
| 2015/0364241 A1 * | 12/2015 | Groves | H01F 41/041 |
| | | | 336/200 |

* cited by examiner

SEMICONDUCTOR DEVICE WITH POLYGONAL INDUCTIVE DEVICE

CROSS-REFERENCE TO RELATED APPLICATION

This application claims the benefits of U.S. Provisional Application No. 62/592,974 filed on Nov. 30, 2017 and U.S. Non-Provisional application Ser. No. 15/965,618 filed on Apr. 27, 2018, which are incorporated by reference in its entirety.

BACKGROUND

The semiconductor industry continues to improve the integration density of various electronic components (e.g., inductors) by continual reductions in minimum feature size, which allow more components to be integrated into a given area. An inductor has one or more conductive paths or turns formed in a spiral or loop shape. The conductive turns are typically formed in a circular or spiral shape. The performance in an inductor defined by the Quality Factor or "Q." The parasitic capacitances and parasitic resistances of an inductor may affect the Quality Factor of the inductor. However, there are many challenges related to reducing the parasitic capacitances and resistances of an inductor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
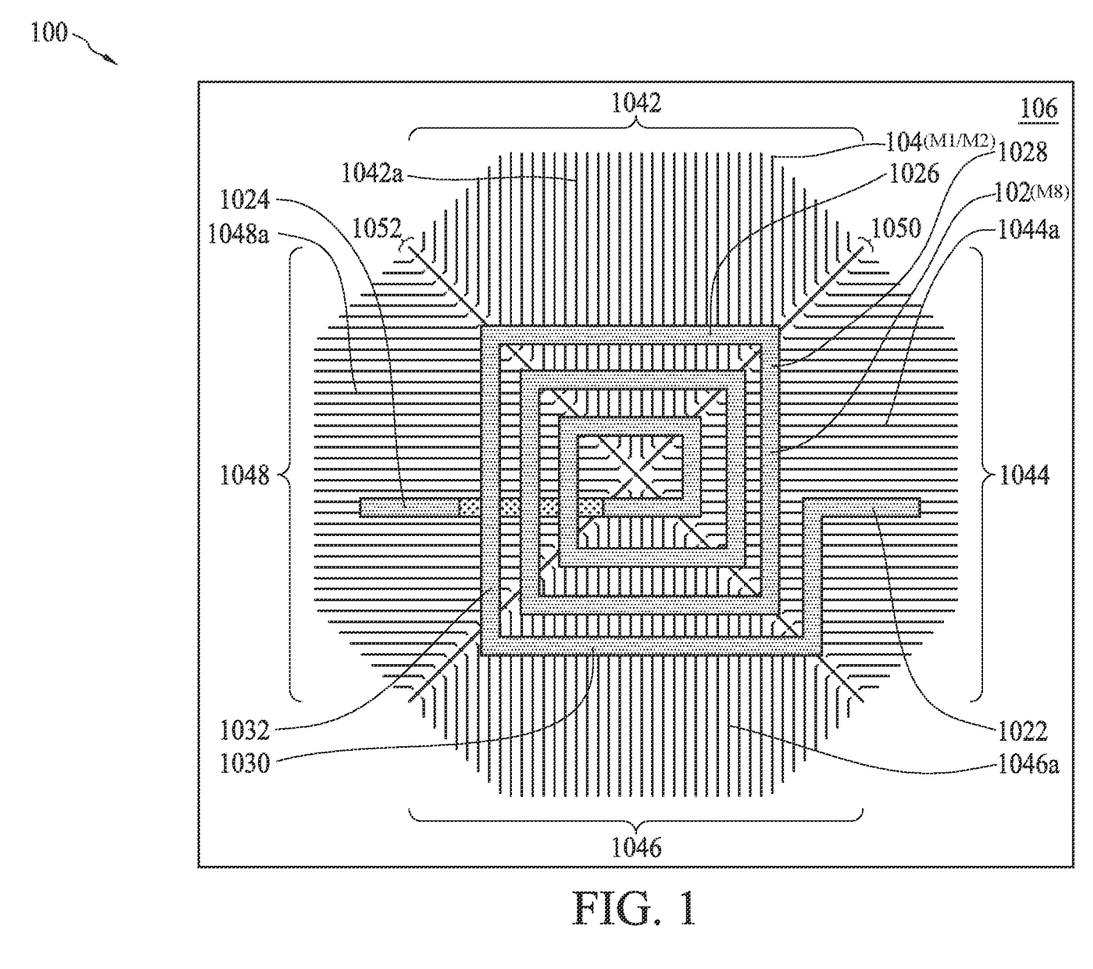
FIG. 1 is a diagram illustrating a semiconductor device in accordance with some embodiments.

FIG. 1 is a diagram illustrating a semiconductor device 100 in accordance with some embodiments. The semiconductor device 100 comprises a polygonal inductive device 102 and a conductive pattern 104. The polygonal inductive device 102 and the conductive pattern 104 are disposed above a semiconductor substrate 106. The conductive pattern 104 may be a patterned ground shield (PGS) disposed under the polygonal inductive device 102. For example, the conductive pattern 104 may be disposed between the polygonal inductive device 102 and the semiconductor substrate 106. The polygonal inductive device 102 and the conductive pattern 104 may be formed in an interconnect structure above the semiconductor substrate, in which the interconnect structure may include metal lines and vias, which are formed in inter-layer dielectric (ILD), and integrated circuits such as transistors may be formed in and/or on the semiconductor substrate. According to some embodiments, the polygonal inductive device 102 may be formed in the top metal layer (e.g. M8) in the interconnect structure, and the conductive pattern 104 may be formed in the lower metal layers (e.g. the first metal layers M1 and M2) in the interconnect structure. According to some embodiments, the top metal layer is thicker than the lowest or the first metal layer in the interconnect structure. The conductive pattern 104 may also be formed by the polysilicon layer on the semiconductor substrate 106. It is noted that the first metal layer M1 and the second metal layer M2 are two different layers in the interconnect structure, wherein the first metal layer M1 and the second metal layer M2 are separated by dielectric layer.

According to some embodiments, the polygonal inductive device 102 is arranged to be a coil with at least one winding. The shape of the polygonal inductive device 102 may be square, rectangular, octagonal, circular, elliptical, toroidal, or other shape. The polygonal inductive device 102 also may be a transformer with the shape of square, rectangular, octagonal, circular, elliptical or other shape. The polygonal inductive device 102 comprises a first terminal 1022, a second terminal 1024, a plurality of horizontal metal lines (e.g. 1026 and 1030), and a plurality of vertical metal lines (e.g. 1028 and 1032). The horizontal metal lines (e.g. 1026 and 1030) and the vertical metal lines (e.g. 1028 and 1032) are configured to be a plurality of windings starting from the first terminal 1022 to the second terminal 1024.

Figure 2:
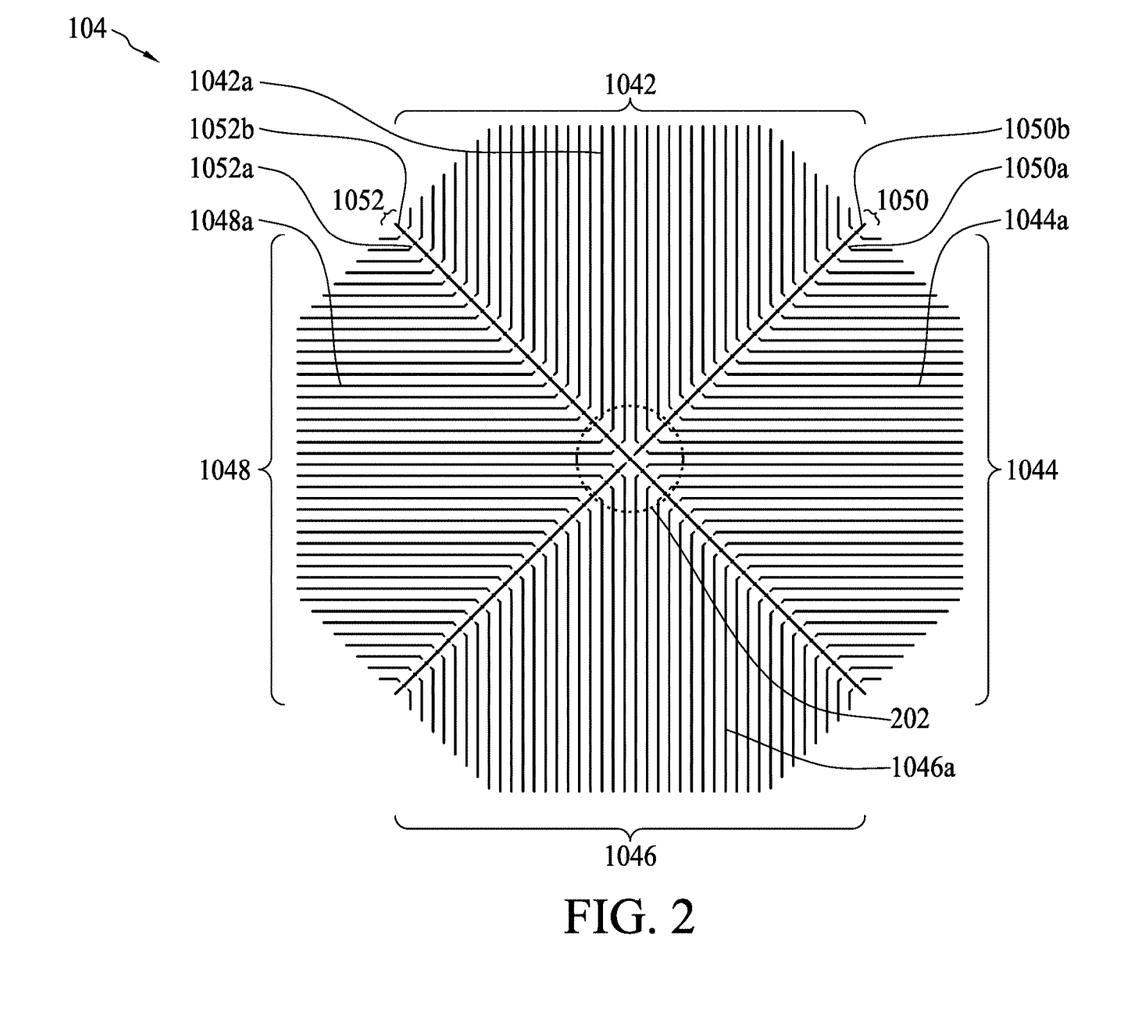
FIG. 2 is a diagram illustrating a conductive pattern in accordance with some embodiments.

FIG. 2 is a diagram illustrating the conductive pattern 104 in accordance with some embodiments. The conductive pattern 104 comprises a first portion 1042, a second portion 1044, a third portion 1046, a fourth portion 1048, a fifth portion 1050, and a sixth portion 1052. The fifth portion 1050 and the sixth portion 1052 are arranged to electrically connected the first portion 1042, the second portion 1044, the third portion 1046, and the fourth portion 1048. The first portion 1042, the second portion 1044, the third portion 1046, the fourth portion 1048, the fifth portion 1050, and the sixth portion 1052 are configured to form an octagonal conductive pattern. The first portion 1042 comprises a plurality of vertical metal lines (e.g. 1042a) formed in a first metal layer (e.g. M2). The second portion 1044 comprises a plurality of horizontal metal lines (e.g. 1044a) formed in the first metal layer. The third portion 1046 comprises a plurality of vertical metal lines (e.g. 1046a) formed in the first metal layer. The fourth portion 1048 comprises a plurality of horizontal metal lines (e.g. 1048a) formed in the first metal layer. The fifth portion 1050 comprises a plurality of first diagonal metal lines (e.g. 1050a) formed in a second metal layer (e.g. M1). The sixth portion 1052 comprises a plurality of second diagonal metal lines (e.g. 1052a) formed in the second metal layer. The plurality of first diagonal metal lines (e.g. 1050a) are arranged to electrically connect a partial of vertical lines in the first portion 1042 to a partial of horizontal lines in the second portion 1044, and to electrically connect a partial of vertical lines in the third portion 1046 to a partial of horizontal lines in the fourth portion 1048. The plurality of second diagonal metal lines (e.g. 1052a) are arranged to electrically connect a partial of vertical lines in the first portion 1042 to a partial of horizontal lines in the fourth portion 1048, and to electrically connect a partial of horizontal lines in the second portion 1044 to a partial of vertical lines in the third portion 1046. According to some embodiments, the fifth portion 1050 further comprises a diagonal metal line 1050b, which is formed in the first metal layer, disposed on the plurality of first diagonal metal lines (e.g. 1050a). The sixth portion 1052 further comprises a diagonal metal line 1052b, which is formed in the first metal layer, disposed on the plurality of second diagonal metal lines (e.g. 1052a). It is noted that the directions of the vertical metal lines, the horizontal metal lines, and the diagonal metal lines of the conductive pattern 104 in FIG. 2 are not intended to be the limitation of the embodiments. The directions of the vertical metal lines, the horizontal metal lines, and the diagonal metal lines in the conductive pattern 104 may be designed to have other directions depending on the design requirement of the device.

According to some embodiments, the metal lines in the conductive pattern 104 are electrically connected with each other, and the conductive pattern 104 is electrically connected to a reference voltage, e.g. the ground voltage.

Moreover, the vertical metal lines (e.g. 1042a) in the first portion 1042, the horizontal metal lines (e.g. 1044a) in the second portion 1044, the vertical metal lines (e.g. 1046a) in the third portion 1046, the horizontal metal lines (e.g. 1048a) in the fourth portion 1048, the diagonal metal line 1050b, and the diagonal metal line 1052b are formed in the second metal layer (i.e. M2) in the interconnect structure, and the first diagonal metal lines (e.g. 1050a) and second diagonal metal lines (e.g. 1052a) are formed in the first metal layer (i.e. M1) in the interconnect structure. Therefore, a plurality of conductive vias or contacts are arranged to electrically connect the metal lines in the first metal layer (i.e. M1) to the metal lines in the second metal layer (i.e. M2). For brevity, merely a portion 202 of the conductive pattern 104 is described in detail.

Figure 3:
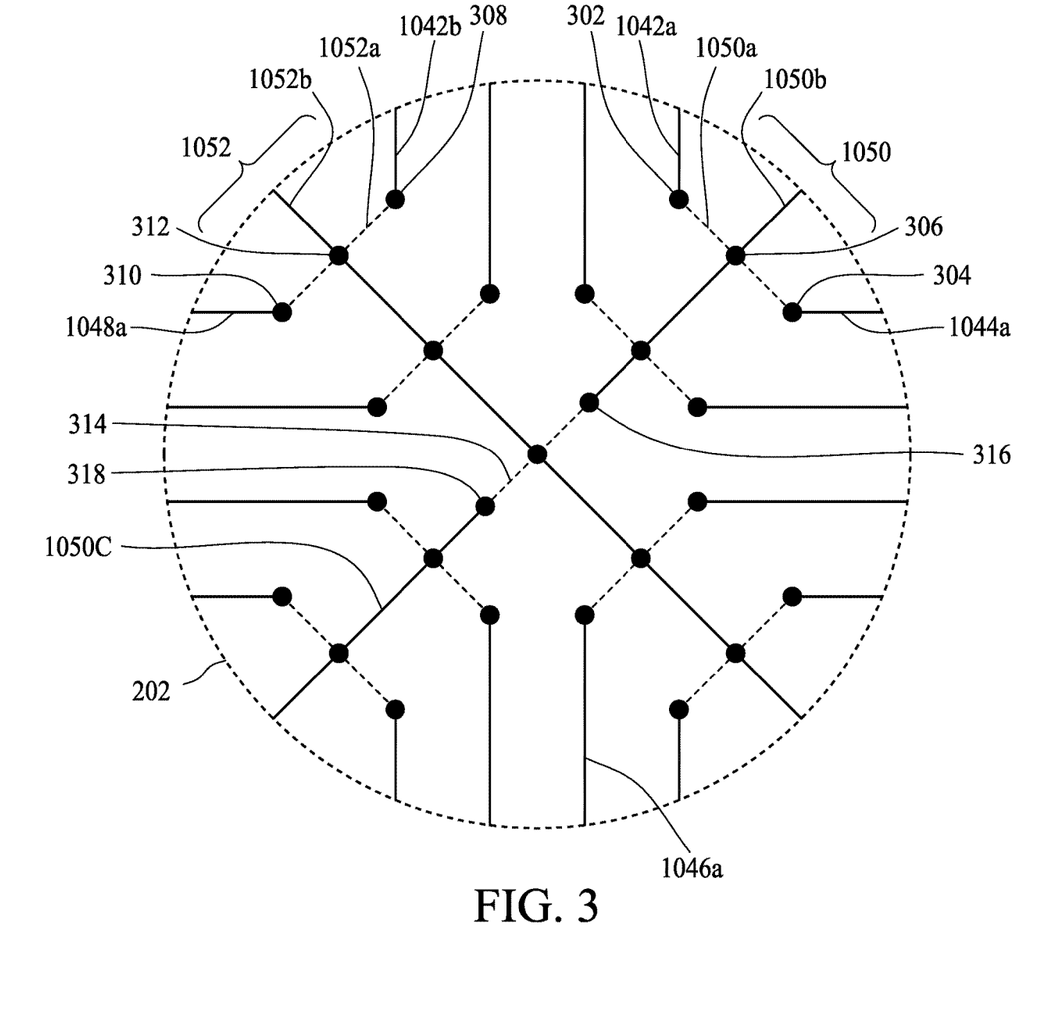
FIG. 3 is a diagram illustrating a portion of the conductive pattern of FIG. 2 in accordance with some embodiments.

FIG. 3 is a diagram illustrating the portion 202 of the conductive pattern 104 in accordance with some embodiments. In the fifth portion 1050, a first conductive via 302 is arranged to electrically connect a terminal of the first diagonal metal line 1050a to a terminal of the vertical metal lines 1042a, a second conductive via 304 is arranged to electrically connect the other terminal of the first diagonal metal line 1050a to a terminal of the horizontal metal lines 1044a, and a third conductive via 306 is arranged to electrically connect the diagonal metal line 1050b to the first diagonal metal line 1050a. In the sixth portion 1052, a first conductive via 308 is arranged to electrically connect a terminal of the second diagonal metal line 1052a to a terminal of the vertical metal lines 1042b, a second conductive via 310 is arranged to electrically connect the other terminal of the second diagonal metal line 1052a to a terminal of the horizontal metal lines 1048a, and a third conductive via 312 is arranged to electrically connect the diagonal metal line 1052b to the second diagonal metal line 1052a. According to some embodiments, the diagonal metal line 1050b is separated from the diagonal metal line 1050c by a metal line 314, which is formed in the first metal layer (i.e. M1), about the central area of the conductive pattern 104. A first conductive via 316 is arranged to electrically connect the diagonal metal line 1050b to a terminal of the metal line 314, and a second conductive via 318 is arranged to electrically connect the diagonal metal line 1050*c* to the other terminal of the metal line 314.

Please refer to FIGS. 1-3 again, the horizontal metal lines (e.g. 1026) of the polygonal inductive device 102 crosses (e.g. orthogonal to) the vertical metal lines (e.g. 1042*a*) in the first portion 1042 of the conductive pattern 104 viewing from the top of the semiconductor device 100. The vertical metal lines (e.g. 1028) of the polygonal inductive device 102 crosses (e.g. orthogonal to) the horizontal metal lines (e.g. 1044*a*) in the second portion 1044 of the conductive pattern 104 viewing from the top. The horizontal metal lines (e.g. 1030) of the polygonal inductive device 102 crosses (e.g. orthogonal to) the vertical metal lines (e.g. 1046*a*) in the third portion 1046 of the conductive pattern 104 viewing from the top. The vertical metal lines (e.g. 1032) of the polygonal inductive device 102 crosses (e.g. orthogonal to) the horizontal metal lines (e.g. 1048*a*) in the fourth portion 1048 of the conductive pattern 104 viewing from the top.

In addition, the corners of the windings of the polygonal inductive device 102 are substantially overlapped with the diagonal metal lines 1050*b* and 1052*b* viewing from the top. For example, the turning point (or the right angle corner) connecting the horizontal metal line 1026 and the vertical metal line 1028 is overlapped with the diagonal metal line 1050*b*. The turning point connecting the vertical metal line 1028 and the horizontal metal line 1030 is overlapped with the diagonal metal line 1052*b*. The turning point connecting the horizontal metal line 1030 and the vertical metal line 1032 is overlapped with the diagonal metal line 1050*c*. The turning point connecting the vertical metal line 1032 and the horizontal metal line 1026 is overlapped with the diagonal metal line 1052*b*.

Moreover, according to the conductive pattern 104 as shown in FIG. 2, the connecting between a vertical metal line (e.g. 1042*a*) and a horizontal line (e.g. 1044*a*) is implemented by a diagonal metal line (e.g. 1050*a*) and the corresponding conductive vias (e.g. 302 and 304). In other words, all the metal lines formed in the second metal layer M2 are straight metal lines (i.e. vertical, horizontal, or diagonal straight lines), and all the metal lines formed in the first metal layer M1 are straight metal lines (i.e. vertical, horizontal, or diagonal straight lines). Therefore, no metal turn or corner is formed in the first metal layer M1 as well as the second metal layer M2. When there has no metal turn or corner formed in the first metal layer M1 as well as the second metal layer M2, the metal lines of the conductive pattern 104 may have relatively better yield.

As the metal lines in the conductive pattern 104 are electrically connected with each other, when one of the metal lines in the conductive pattern 104 is electrically connected to the reference voltage, the conductive pattern 104 is electrically connected to the reference voltage. In other words, any metal line (e.g. 1050*b* or 1042*a*) in the conductive pattern 104 may be arranged to be the specific node to connect to the reference voltage.

Figure 4:
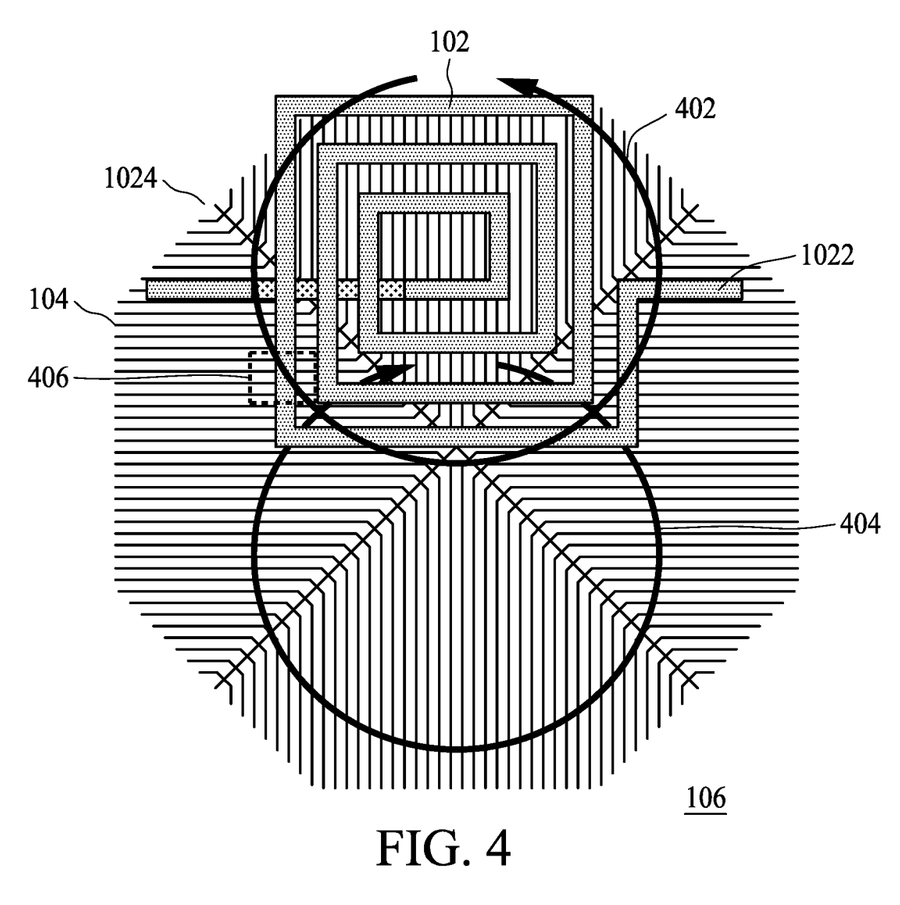
FIG. 4 is a diagram illustrating current flows of the semiconductor device of FIG. 1 in accordance with some embodiments.
Figure 5:
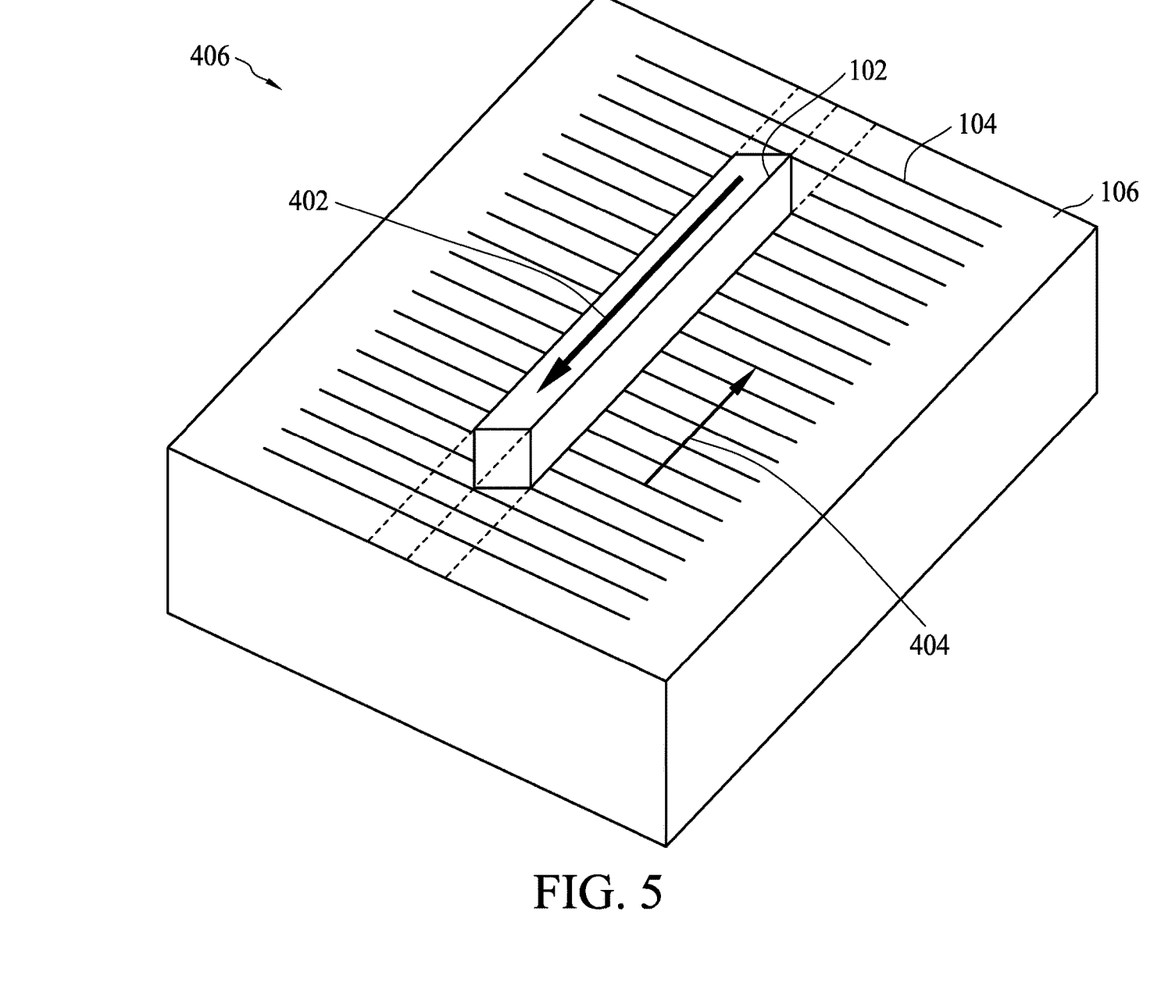
FIG. 5 is a diagram illustrating the current flows in a portion of the semiconductor device of FIG. 4 in accordance with some embodiments.

FIG. 4 is a diagram illustrating the current flows of the semiconductor device 100 in accordance with some embodiments. FIG. 5 is a diagram illustrating the current flows in a portion 406 of the semiconductor device 100 in accordance with some embodiments. According to some embodiments, a first current signal 402 with anti-clockwise direction flows to the first terminal 1022 from the second terminal 1024 of the polygonal inductive device 102. A second current signal 404 with reversed direction (i.e. clockwise direction) is induced in the conductive pattern 104 and/or the substrate 106. The second current signal 404 may be the eddy current induced by the first current signal 402. The second current signal 404 may lead to the energy loss of the polygonal inductive device 102. However, in the present embodiments, the metal lines of the polygonal inductive device 102 is orthogonal to the metal lines of the conductive pattern 104. As shown in FIG. 5, when the metal lines of the polygonal inductive device 102 is orthogonal to the metal lines of the conductive pattern 104, the second current signal 404 on the conductive pattern 104 may be suppressed as there is no available current conductive path to flow the second current signal 404. Accordingly, the energy loss of the polygonal inductive device 102 is reduced.

Figure 6:
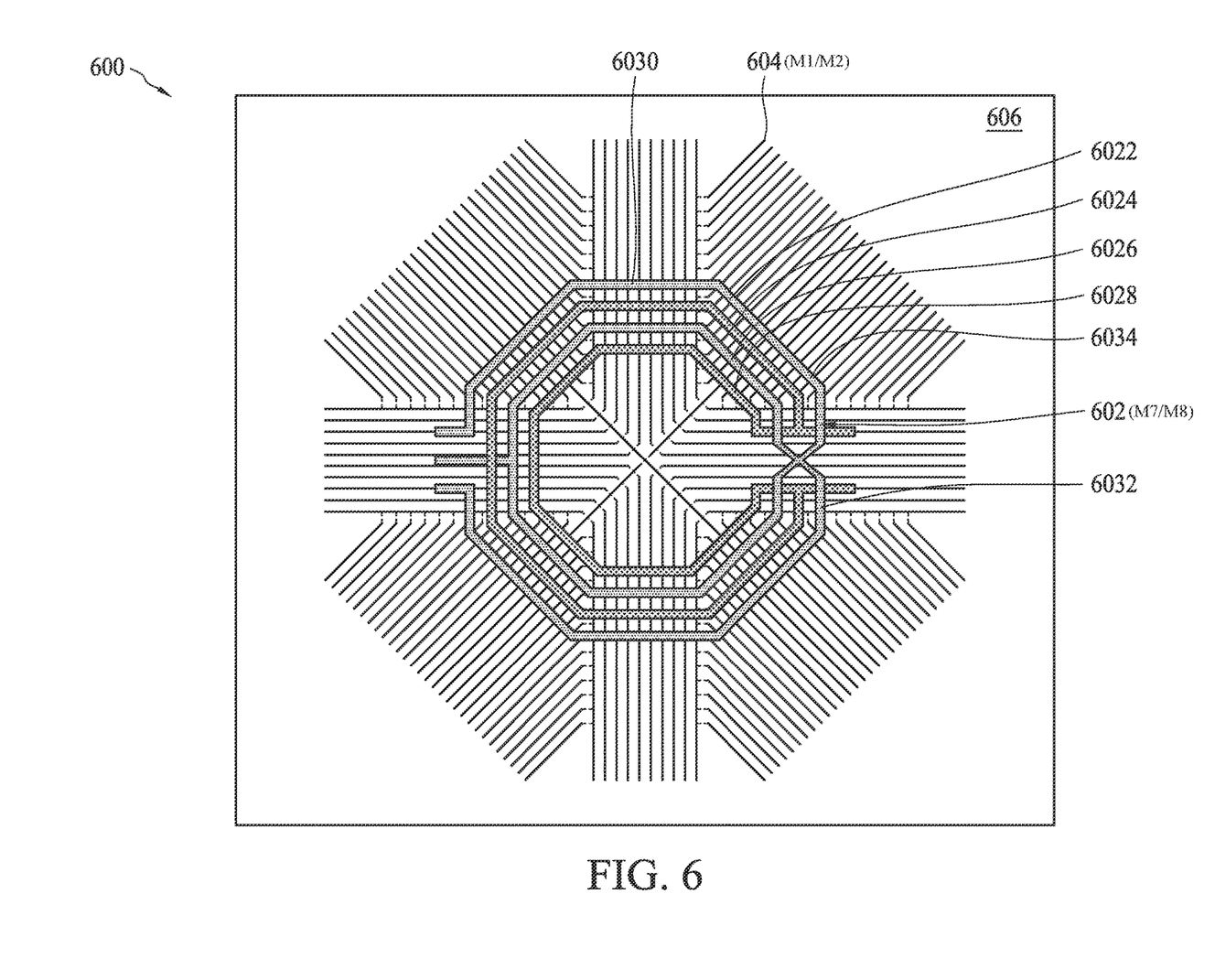
FIG. 6 is a diagram illustrating a semiconductor device in accordance with some embodiments.

FIG. 6 is a diagram illustrating a semiconductor device 600 in accordance with some embodiments. The semiconductor device 600 comprises a polygonal inductive device 602 and a conductive pattern 604. The polygonal inductive device 602 and the conductive pattern 604 are disposed above a semiconductor substrate 606. The conductive pattern 604 may be a patterned ground shield (PGS) disposed under the polygonal inductive device 602. The polygonal inductive device 602 and the conductive pattern 604 may be formed in an interconnect structure above the semiconductor substrate, in which the interconnect structure may include metal lines and vias, which are formed in inter-layer dielectric (ILD), and integrated circuits such as transistors may be formed in and/or on the semiconductor substrate. According to some embodiments, the polygonal inductive device 602 may be a transformer formed in the top metal layer (e.g. M8) and the second top metal layer (e.g. M7) in the interconnect structure, and the conductive pattern 604 may be formed in the lower metal layers (e.g. the first metal layers M1 and M2) in the interconnect structure. It is noted that the polygonal inductive device 602 may be an inductor. The conductive pattern 604 may also be formed by the polysilicon layer on the semiconductor substrate 606.

The polygonal inductive device 602 comprises a plurality of octagonal windings 6022-6028. The octagonal windings 6022-6028 are formed in the eighth metal layer M8 and the seventh metal layer M7, for example, of the semiconductor device 600 respectively. The octagonal windings 6022-6028 comprises metal lines 6030, 6032, 6034 with three different directions, i.e. horizontal, vertical, and diagonal, as shown in FIG. 6. The detailed description of the polygonal inductive device 602 is omitted here for brevity.

Figure 7:
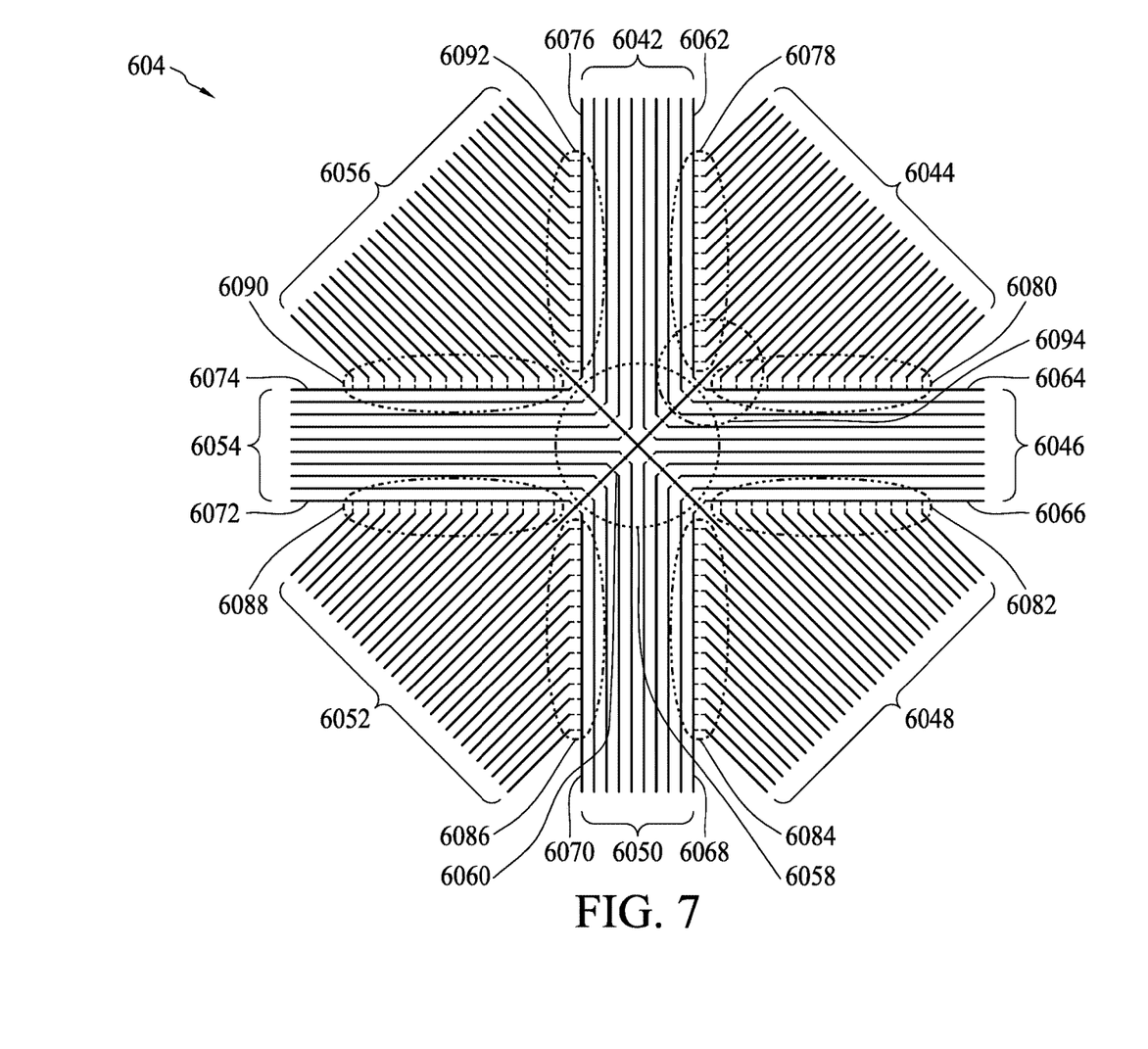
FIG. 7 is a diagram illustrating a conductive pattern in accordance with some embodiments.

FIG. 7 is a diagram illustrating the conductive pattern 604 in accordance with some embodiments. The conductive pattern 604 comprises a plurality of vertical line portions 6042 and 6050, a plurality of horizontal line portions 6046 and 6054, and a plurality of diagonal line portions 6044, 6048, 6052, and 6056. According to some embodiments, the vertical line portions 6042, 6050, the horizontal line portions 6046, 6054, and the diagonal line portions 6044, 6048, 6052, and 6056 are formed in the second metal layer M2. The vertical line portions 6042 and 6050 are electrically connected to the horizontal line portions 6046 and 6054 in the central region 6058 of the conductive pattern 604. In the central region 6058, a plurality of diagonal metal lines (e.g. 6060), which are formed in the first metal layer M1, are arranged to electrically connect the metal lines in the vertical line portions 6042 and 6050 and the metal lines in the horizontal line portions 6046 and 6054. In this embodiment, the central region 6058 of the conductive pattern 604 is similar to the portion 202 of the conductive pattern 104, thus the detailed description is omitted here for brevity.

According to some embodiments, a right boundary metal line 6062 of the vertical line portion 6042 is electrically connected to a portion of metal lines in the diagonal line portion 6044 by a plurality of horizontal metal lines 6078. An upper boundary metal line 6064 of the horizontal line portion 6046 is electrically connected to the other portion of metal lines in the diagonal line portion 6044 by a plurality of vertical metal lines 6080. A lower boundary metal line 6066 of the horizontal line portion 6046 is electrically connected to a portion of metal lines in the diagonal line portion 6048 by a plurality of vertical metal lines 6082. A right boundary metal line 6068 of the vertical line portion 6050 is electrically connected to the other portion of metal lines in the diagonal line portion 6048 by a plurality of horizontal metal lines 6084. A left boundary metal line 6070 of the vertical line portion 6050 is electrically connected to a portion of metal lines in the diagonal line portion 6052 by a plurality of horizontal metal lines 6086. A lower boundary metal line 6072 of the horizontal line portion 6054 is electrically connected to the other portion of metal lines in the diagonal line portion 6052 by a plurality of vertical metal lines 6088. An upper boundary metal line 6074 of the horizontal line portion 6054 is electrically connected to a portion of metal lines in the diagonal line portion 6056 by a plurality of vertical metal lines 6090. An left boundary metal line 6076 of the vertical line portion 6050 is electrically connected to the other portion of metal lines in the diagonal line portion 6056 by a plurality of horizontal metal lines 6092. It is noted that the directions of the vertical metal lines, the horizontal metal lines, and the diagonal metal lines of the conductive pattern 604 in FIG. 7 are not intended to be the limitation of the embodiments. The directions of the vertical metal lines, the horizontal metal lines, and the diagonal metal lines in the conductive pattern 604 may be designed to have other directions depending on the design requirement of the device.

According to some embodiments, the horizontal metal lines 6078, 6084, 6086, 6092, and the vertical metal lines 6080, 6082, 6088, and 6090 are formed in the first metal layer M1. Therefore, a plurality of conductive vias or contacts are arranged to electrically connect the metal lines of the horizontal metal lines 6078, 6084, 6086, 6092, and the vertical metal lines 6080, 6082, 6088, and 6090 to the metal lines of the vertical line portions 6042, 6050, the horizontal line portions 6046, 6054, and the diagonal line portions 6044, 6048, 6052, and 6056. For brevity, merely a portion 6094 of the conductive pattern 604 is described in detail.

Figure 8:
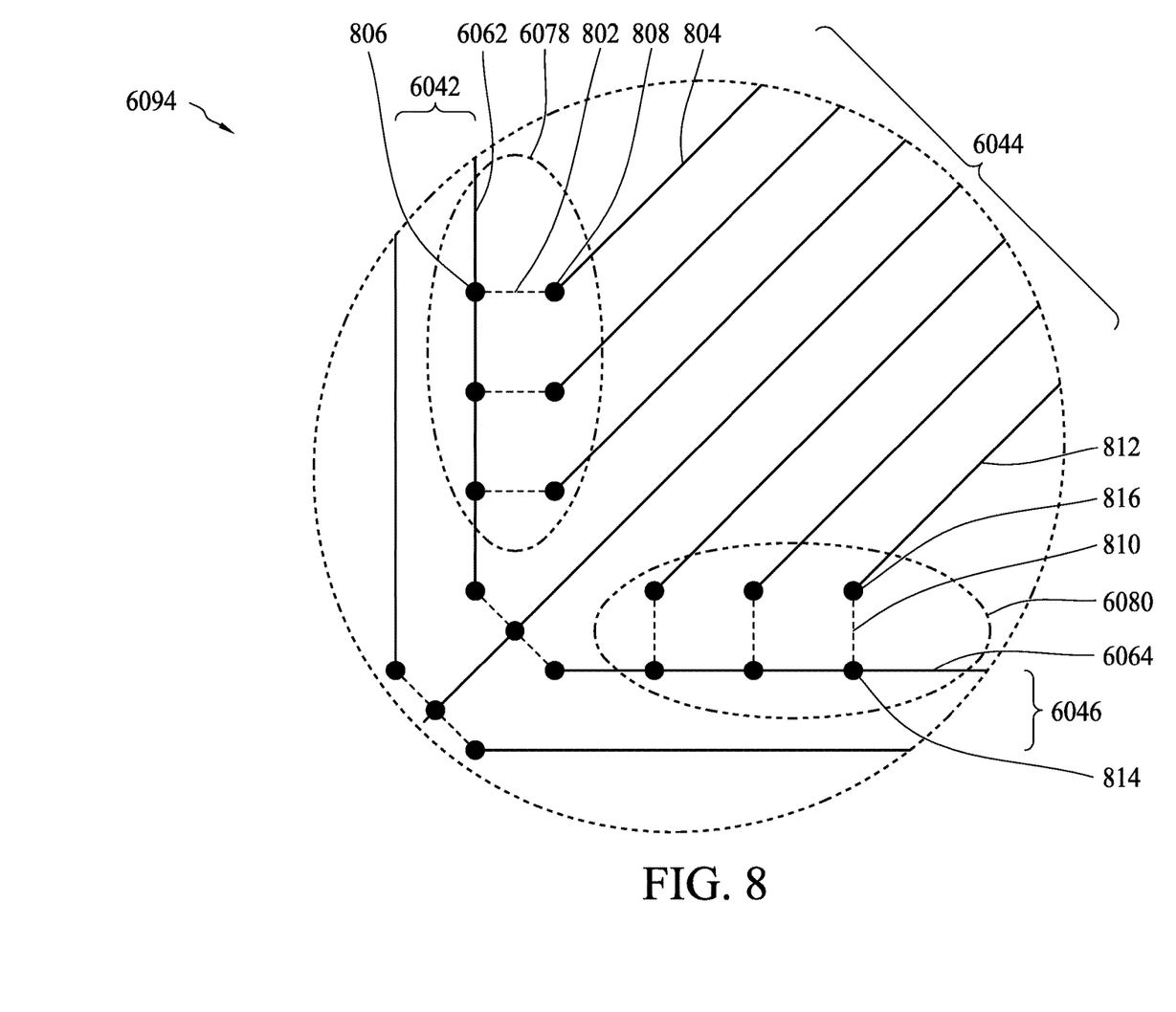
FIG. 8 is a diagram illustrating a portion of the conductive pattern of FIG. 7 in accordance with some embodiments.

FIG. 8 is a diagram illustrating the portion 6094 of the conductive pattern 604 in accordance with some embodiments. In the horizontal metal lines 6078, for example, a horizontal metal line 802 is disposed between the right boundary metal line 6062 of the vertical line portion 6042 and the diagonal metal line 804 of the diagonal line portion 6044. A first conductive via 806 is arranged to electrically connect a terminal of the horizontal metal line 802 to the right boundary metal line 6062. A second conductive via 808 is arranged to electrically connect the other terminal of the horizontal metal line 802 to a terminal of the diagonal metal line 804.

In addition, in the vertical metal lines 6080, for example, a vertical metal line 810 is disposed between the upper boundary metal line 6064 of the horizontal line portion 6046 and the diagonal metal line 812 of the diagonal line portion 6044. A first conductive via 814 is arranged to electrically connect a terminal of the vertical metal line 810 to the upper boundary metal line 6064. A second conductive via 816 is arranged to electrically connect the other terminal of the vertical metal line 810 to a terminal of the diagonal metal line 812.

As the metal lines in the conductive pattern 604 are electrically connected with each other, when one of the metal lines in the conductive pattern 604 is electrically connected to the reference voltage, the conductive pattern 604 is electrically connected to the reference voltage. In other words, any metal line in the conductive pattern 604 may be arranged to be the specific node to connect to the reference voltage.

According to FIGS. 6-8, the metal lines of the windings 6022-6028 in the polygonal inductive device 602 is orthogonal to the metal lines of the conductive pattern 604 viewing from the top of the semiconductor device 600. The corners of the windings 6022-6028 of the polygonal inductive device 6102 are substantially overlapped with the horizontal metal lines 6078, 6084, 6086, 6092 and the vertical metal lines 6080, 6082, 6088, 6090 viewing from the top of the semiconductor device 600. As described in the above FIGS. 4-5, when the metal lines of the polygonal inductive device 602 is orthogonal to the metal lines of the conductive pattern 604, the eddy current signal, which is induced by the current signal of the polygonal inductive device 602, on the conductive pattern 604 may be suppressed as there is no available current conductive path to flow the eddy current signal. Accordingly, the energy loss of the polygonal inductive device 602 is reduced.

Moreover, all the metal lines formed in the second metal layer M2 are straight metal lines (i.e. vertical, horizontal, or diagonal straight lines), and all the metal lines formed in the first metal layer M1 are also straight metal lines (i.e. vertical, horizontal, or diagonal straight lines). Therefore, no metal turn or corner is formed in the first metal layer M1 as well as the second metal layer M2. When there has no metal turn or corner formed in the first metal layer M1 as well as the second metal layer M2, the metal lines of the conductive pattern 104 may have relatively better yield.

Figure 9:
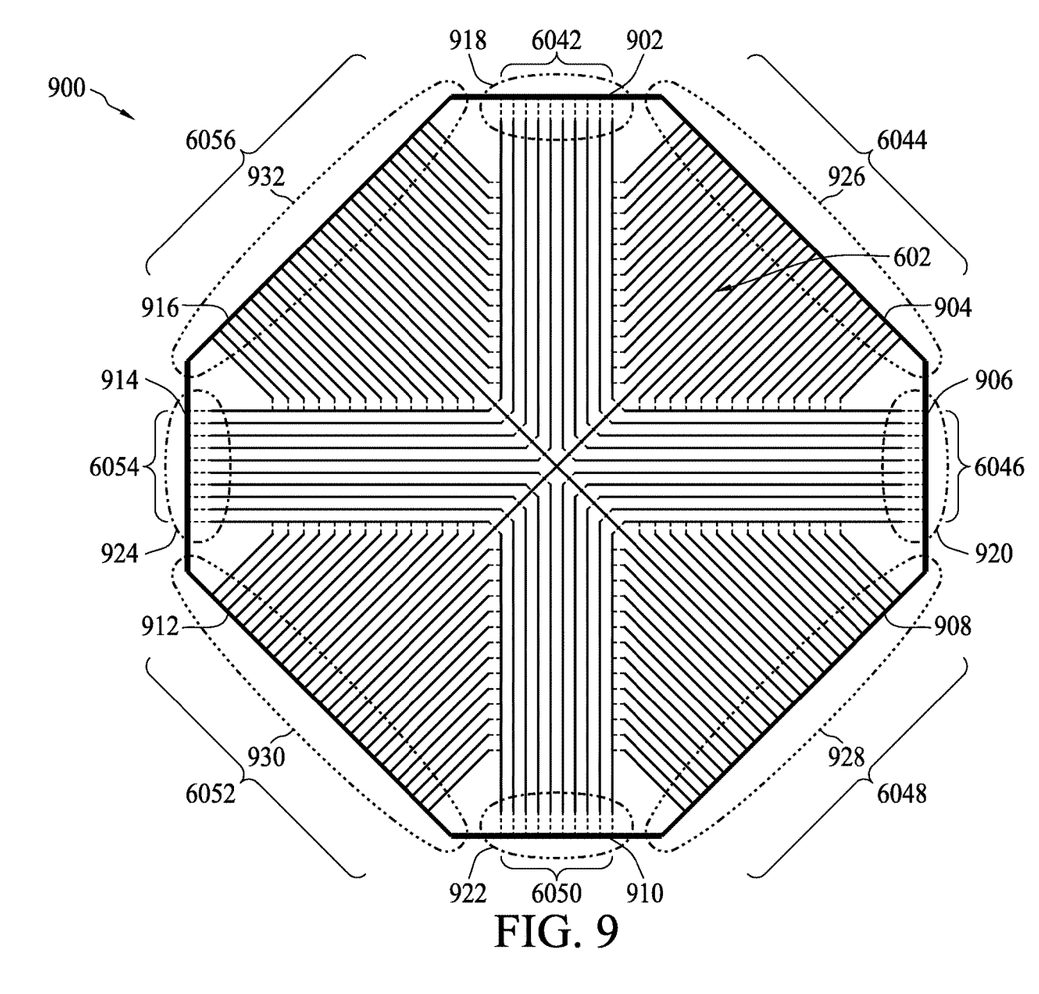
FIG. 9 is a diagram illustrating a conductive pattern in accordance with some embodiments.

FIG. 9 is a diagram illustrating a conductive pattern 900 in accordance with some embodiments. The conductive pattern 900 is a modification of the conductive pattern 604. For brevity, a similar numeral (i.e. 604) is used in FIG. 9. In comparison to the conductive pattern 604, the conductive pattern 900 further comprises a plurality of metal lines 902, 904, 906, 908, 910, 912, 914, and 916 surrounding the conductive pattern 604. The metal lines 902, 904, 906, 908, 910, 912, 914, and 916 are electrically connected to the conductive pattern 604 by a plurality of conductive vias. According to some embodiments, the metal lines 902, 906, 910, and 914 are formed in the second metal layer M2, and the metal lines 904, 908, 912, and 916 are formed in the first metal layer M1.

According to some embodiments, a plurality of vertical metal lines 918 are arranged to electrically connect the metal lines in the vertical line portion 6042 to the metal line 902. A plurality of horizontal metal lines 920 are arranged to electrically connect the metal lines in the horizontal line portion 6046 to the metal line 906. A plurality of vertical metal lines 922 are arranged to electrically connect the metal lines in the vertical line portion 6050 to the metal line 910. A plurality of horizontal metal lines 924 are arranged to electrically connect the metal lines in the horizontal line portion 6054 to the metal line 914. The vertical metal lines 918, 922, and the horizontal metal lines 920, 924 are formed in the first metal layer M1. Therefore, a plurality of conductive vias are arranged to electrically connect the metal lines (e.g. 918) in the first metal layer M1 to the metal lines (e.g. 902 and 6042) in the second metal layer M2.

Figure 10:
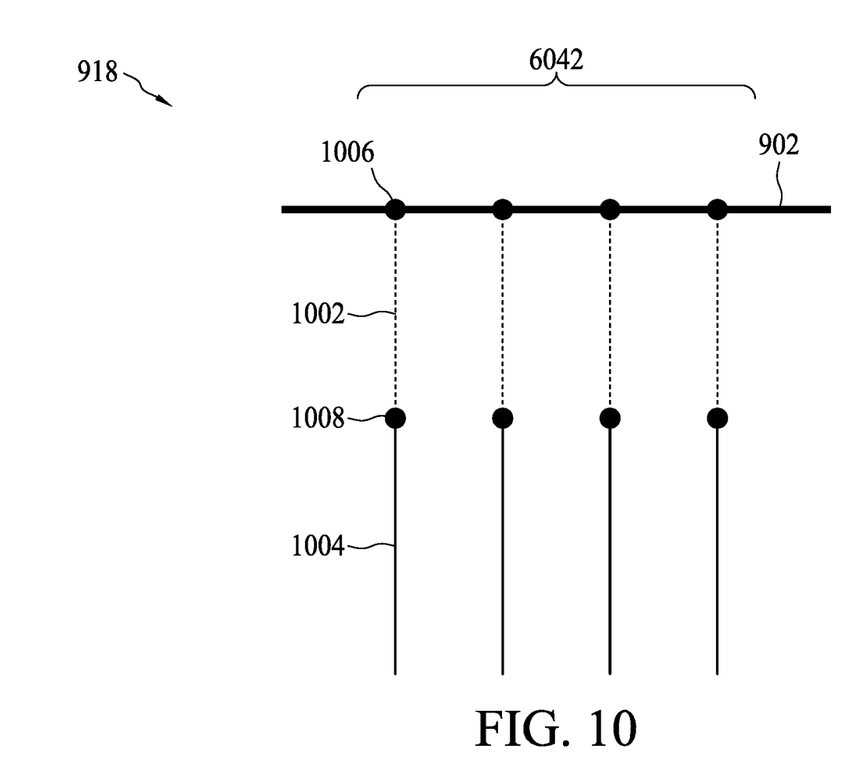
FIG. 10 is a diagram illustrating the vertical metal lines of the conductive pattern of FIG. 9 in accordance with some embodiments.

FIG. 10 is a diagram illustrating the vertical metal lines 918 of the conductive pattern 900 in accordance with some embodiments. In the vertical line portions 6042, a vertical line 1002, for example, is disposed between the vertical metal line 1004 and the metal line 902. A first conductive via 1006 is arranged to electrically connect a terminal of the vertical line 1002 to the metal line 902. A second conductive via 1008 is arranged to electrically connect the other terminal of the vertical line 1002 to a terminal of the vertical metal line 1004. The configurations of the metal lines 920, 922, and 924 are similar to the configuration of the metal lines 918, thus the detailed description is omitted here for brevity.

In addition, for the diagonal line portions 6044, 6048, 6052, and 6056, a plurality of conductive vias are arranged to electrically connect the metal lines 904, 908, 912, and 916 in the first metal layer M1 to the metal lines in the diagonal line portions 6044, 6048, 6052, and 6056 in the second metal layer M2 respectively.

Figure 11:
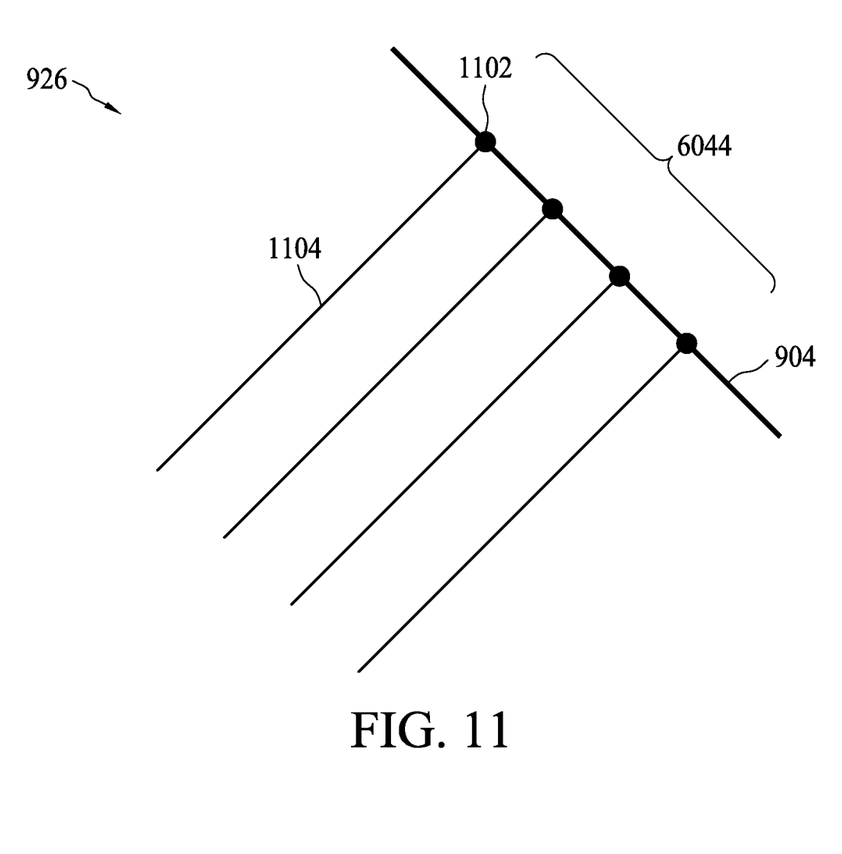
FIG. 11 is a diagram illustrating a portion of the conductive pattern of FIG. 9 in accordance with some embodiments.

FIG. 11 is a diagram illustrating the portion 926 of the conductive pattern 900 in accordance with some embodiments. In the diagonal line portions 6044, a conductive via 1102, for example, is arranged to electrically connect a terminal of the diagonal line 1004 to the metal line 904. The metal line configurations of the portions 928, 930, and 932 are similar to the configuration of the 926, thus the detailed description is omitted here for brevity.

Briefly, in the present embodiments, the metal lines of the windings in a polygonal inductive device are orthogonal to the metal lines of the patterned ground shield, and the eddy current signal on the patterned ground shield are reduced. Accordingly, the energy loss of the polygonal inductive device is reduced. The patterned ground shield may improve the quality factor and isolation from the substrate. Moreover, all the metal lines formed in the patterned ground shield are straight metal lines, and no metal turn or corner is formed in a single metal layer. When there has no metal turn or corner formed in a single metal layer, the metal lines of the patterned ground shield may have relatively better yield.

According to some embodiments, a semiconductor device is provided. The semiconductor device comprises a polygonal inductive device, a first conductive line, a second conductive line, and a first conductive via. The polygonal inductive device is disposed on a first layer on a substrate, and the polygonal inductive device comprises a first line portion. The first conductive line is disposed on a second layer on the substrate. The second conductive line is disposed on a third layer on the substrate. The first conductive via is arranged to electrically couple the second conductive line to the first conductive line. The first layer is different from the second layer and the third layer. The first conductive line is electrically connected to a reference voltage, and the first conductive line crosses the first line portion viewing from a top of the semiconductor device.

According to some embodiments, a semiconductor device is provided. The semiconductor device comprises a plurality of first conductive lines, a plurality of second conductive lines, a plurality of third conductive lines, a plurality of first conductive vias, and a plurality of second conductive vias. The plurality of first conductive lines are disposed on a first layer on the substrate, wherein the plurality of first conductive lines are arranged to be a first direction. The plurality of second conductive lines are disposed on the first layer, wherein the plurality of second conductive lines are arranged to be a second direction. The plurality of third conductive lines are disposed on a second layer on the substrate, wherein the plurality of third conductive lines are arranged to be a third direction. The plurality of first conductive vias are arranged to electrically connect the plurality of first conductive lines to the plurality of third conductive lines respectively. The plurality of second conductive vias are arranged to electrically connect the plurality of second conductive lines to the plurality of third conductive lines respectively.

According to some embodiments, a semiconductor device is provided. The semiconductor device comprises a polygonal inductive device and a conductive pattern. The polygonal inductive device is disposed on a first layer on a substrate, and the polygonal inductive device comprises a first line portion and a second line portion. The conductive pattern is electrically connected to a reference voltage. The conductive pattern comprises a plurality of first conductive lines, a plurality of second conductive lines, a plurality of third conductive lines, a plurality of first conductive vias, and a plurality of second conductive vias. The plurality of first conductive lines are disposed on a second layer on the substrate. The plurality of second conductive lines are disposed on the second layer. The plurality of third conductive lines are disposed on a third layer on the substrate. The plurality of first conductive vias arranged to electrically connect a specific conductive line in the plurality of first conductive lines to the plurality of third conductive lines respectively. The plurality of second conductive vias are arranged to electrically connect the plurality of second conductive lines to the plurality of third conductive lines respectively. The first line portion is orthogonal to the plurality of first conductive lines viewing from a top of the semiconductor device, and the second line portion is orthogonal to the plurality of second conductive lines viewing from the top.

According to some embodiments, a semiconductor device is provided. The semiconductor device comprises a semiconductor substrate; an inductive device, disposed over the semiconductor substrate; and a conductive pattern, disposed between the semiconductor substrate and the inductive device, and comprising: a first metal line, disposed in a first layer on the semiconductor substrate; a second metal line, disposed in the first layer and separated from the first metal line, wherein the second metal line is arranged to be orthogonal to the first metal line, and a first terminal of the first metal line is proximal to a second terminal of the second metal line; and a third metal line, disposed in a second layer on the semiconductor substrate and electrically connecting the first metal line to the second metal line, wherein the first layer and the second layer are at different elevations, and the third metal line is disposed between the first terminal of the first metal line and the second terminal of the second metal line from a top view perspective.

According to some embodiments, a semiconductor device is provided. The semiconductor device comprises a substrate; a first conductive line, disposed on a first layer on the substrate and extending along a first direction; a second conductive line, disposed on the first layer and extending along a second direction orthogonal to the first direction; a plurality of third conductive lines, disposed on a second layer on the substrate different form the first layer, wherein each of the plurality of third conductive lines is orthogonal to and overlaps the first conductive line; and a plurality of fourth conductive lines, disposed on the second layer and separated from the plurality of third conductive lines, wherein each of the plurality of fourth conductive lines is orthogonal to and overlaps the second conductive line, wherein each of the plurality of third conductive lines is orthogonal to each of the plurality of fourth conductive lines.

According to some embodiments, a semiconductor device is provided. The semiconductor device comprises a substrate; a first conductive line, disposed on a first layer on the substrate, and designed to be a first direction; a second conductive line, disposed on the first layer, and designed to be a second direction orthogonal to the first direction; a plurality of third conductive lines, disposed on the first layer, and designed to be a third direction different form the first direction and the second direction, wherein the first conductive line, the second conductive line and the plurality of third conductive lines are separated from one another on the first layer; and a plurality of fourth conductive lines, disposed on a second layer on the substrate different from the first layer, and designed to be the second direction orthogonal to the first direction, wherein each of the plurality of third conductive lines is electrically connected to the first conductive line through the plurality of fourth conductive lines respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
an inductive device, disposed over the semiconductor substrate; and
a conductive pattern, disposed between the semiconductor substrate and the inductive device, and comprising:
a first metal line, disposed in a first layer on the semiconductor substrate;
a second metal line, disposed in the first layer and separated from the first metal line, wherein the second metal line is arranged to be orthogonal to the first metal line, and a first terminal of the first metal line is proximal to a second terminal of the second metal line; and
a third metal line, disposed in a second layer on the semiconductor substrate and electrically connecting the first metal line to the second metal line,
wherein the first layer and the second layer are at different elevations, and the third metal line is disposed between the first terminal of the first metal line and the second terminal of the second metal line from a top view perspective.

2. The semiconductor device of claim 1, further comprising:
a first conductive via, arranged to electrically connect the first metal line to the third metal line;
a second conductive via, arranged to electrically connect the second metal line to the third metal line.

3. The semiconductor device of claim 2, wherein the first terminal of the first metal line is in contact with the first conductive via.

4. The semiconductor device of claim 2, wherein the second terminal of the second metal line is in contact with the second conductive via.

5. The semiconductor device of claim 1, further comprising:
a fourth metal line, disposed on the first layer;
a third conductive via, arranged to electrically connect the third metal line to the fourth metal line.

6. The semiconductor device of claim 5, wherein the fourth metal line is orthogonal to the third metal line from the top perspective.

7. The semiconductor device of claim 1, further comprising:
a fifth metal line, disposed on the first layer;
a sixth metal line, disposed on the first layer;
a seventh metal line, disposed on the second layer;
a fourth conductive via, arranged to electrically connect the fifth metal line to the seventh metal line;
a fifth conductive via, arranged to electrically connect the sixth metal line to the seventh metal line,
wherein the fifth metal line, the sixth metal line and the seventh metal line are arranged to be a straight line from the top perspective.

8. The semiconductor device of claim 7, wherein the fifth metal line is orthogonal to the sixth metal line.

9. The semiconductor device of claim 7, wherein the seventh metal line is parallel to the third metal line.

10. The semiconductor device of claim 7, further comprising:
a fourth metal line, disposed on the first layer;
a third conductive via, arranged to electrically connect the third metal line to the fourth metal line,
wherein the seventh metal line is orthogonal to the fourth metal line.

11. The semiconductor device of claim 1, wherein the inductive device includes a first line portion and a second line portion, the first line portion is orthogonal to the first metal line from the top perspective, and the second line portion is orthogonal to the second metal line from the top perspective.

12. A semiconductor device, comprising:
a substrate;
a first conductive line, disposed on a first layer on the substrate and extending along a first direction;
a second conductive line, disposed on the first layer and extending along a second direction orthogonal to the first direction;
a plurality of third conductive lines, disposed on a second layer on the substrate different from the first layer and disposed along the second direction, wherein each of the plurality of third conductive lines is orthogonal to and overlaps the first conductive line;
a plurality of first conductive vias, arranged to electrically connect the first conductive line to the plurality of third conductive lines; and
a plurality of fourth conductive lines, disposed on the second layer and separated from the plurality of third conductive lines, wherein each of the plurality of fourth conductive lines is orthogonal to and overlaps the second conductive line, wherein each of the plurality of third conductive lines is orthogonal to each of the plurality of fourth conductive lines.

13. The semiconductor device of claim 12, further comprising:
a plurality of second conductive vias, arranged to electrically connect the second conductive line to the plurality of fourth conductive lines.

14. The semiconductor device of claim 13, wherein one of the plurality of first conductive vias is arranged to electrically connect the first conductive line to the second conductive line.

15. The semiconductor device of claim 13, wherein each of the plurality of first conductive vias extends between the first layer and the second layer.

16. The semiconductor device of claim 12, wherein the plurality of fourth conductive lines are disposed along the first direction.

17. A semiconductor device, comprising:
- a substrate;
- a first conductive line, disposed on a first layer on the substrate, and designed to be a first direction;
- a second conductive line, disposed on the first layer, and designed to be a second direction orthogonal to the first direction;
- a plurality of third conductive lines, disposed on the first layer, and designed to be a third direction different form the first direction and the second direction, wherein the first conductive line, the second conductive line and the plurality of third conductive lines are separated from one another on the first layer; and
- a plurality of fourth conductive lines, disposed on a second layer on the substrate different from the first layer, and designed to be the second direction orthogonal to the first direction, wherein each of the plurality of third conductive lines is electrically connected to the first conductive line through the plurality of fourth conductive lines respectively.

18. The semiconductor device of claim 17, further comprising a plurality of first conductive vias, arranged to electrically connect the first conductive line to the plurality of fourth conductive lines.

19. The semiconductor device of claim 18, wherein each of the plurality of first conductive vias extends between the first layer and the second layer of the substrate.

20. The semiconductor device of claim 17, wherein the plurality of third conductive lines are electrically coupled with the plurality of fourth conductive lines respectively.

* * * * *